United States Patent
Jeong et al.

(10) Patent No.: US 11,815,236 B2
(45) Date of Patent: Nov. 14, 2023

(54) LED MODULE AND VEHICLE INCLUDING SAME

(71) Applicant: HYUNDAI MOBIS CO., LTD., Seoul (KR)

(72) Inventors: Seok Ho Jeong, Yongin-si (KR); Jung Young Kim, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 18/063,519

(22) Filed: Dec. 8, 2022

(65) Prior Publication Data

US 2023/0304641 A1    Sep. 28, 2023

(30) Foreign Application Priority Data

Mar. 25, 2022   (KR) ................. 10-2022-0037434

(51) Int. Cl.
*F21V 8/00*    (2006.01)
*F21S 41/143*  (2018.01)
*F21S 41/25*   (2018.01)
*F21S 41/20*   (2018.01)
*F21S 41/32*   (2018.01)

(52) U.S. Cl.
CPC ............ *F21S 41/143* (2018.01); *F21S 41/25* (2018.01); *F21S 41/285* (2018.01); *F21S 41/32* (2018.01)

(58) Field of Classification Search
CPC ........ F21S 41/143; F21S 41/25; F21S 41/285; F21S 41/32
See application file for complete search history.

(56) References Cited

U.S. PATENT DOCUMENTS

| 3,532,871 A | * | 10/1970 | Shipman | F21S 43/40 |
|---|---|---|---|---|
| | | | | 359/548 |
| 2011/0194034 A1 | * | 8/2011 | Shimizu | G02B 6/0036 |
| | | | | 348/739 |
| 2011/0249462 A1 | * | 10/2011 | Koizumi | F21S 43/14 |
| | | | | 362/519 |
| 2013/0194795 A1 | * | 8/2013 | Onaka | G02B 19/0066 |
| | | | | 362/326 |
| 2014/0071703 A1 | * | 3/2014 | Motomura | F21S 43/249 |
| | | | | 362/511 |
| 2016/0351753 A1 | * | 12/2016 | Huang | H01L 33/486 |

* cited by examiner

*Primary Examiner* — Elmito Breval
(74) *Attorney, Agent, or Firm* — DLA PIPER LLP (US)

(57) ABSTRACT

A light emitting diode (LED) module and a vehicle including the same, the LED module including a cover part, a substrate part connected to a front side of the cover part, a light emitting part that is electrically connected to the substrate part, is disposed in front of the substrate part, and emits light through a side surface thereof, and a lens part surrounding the side surface of the light emitting part and disposed in front of the substrate part, wherein the lens part has a fine protrusion shape on an outer surface thereof.

14 Claims, 33 Drawing Sheets

LED MODULE AND VEHICLE INCLUDING SAME

CROSS-REFERENCE TO RELATED APPLICATION

This application claims the benefit of priority to Korean Patent Application No. 10-2022-0037434, filed in the Korean Intellectual Property Office on Mar. 25, 2022, the entire contents of which are incorporated herein by reference.

TECHNICAL FIELD

The present disclosure relates to a light emitting diode (LED) module and a vehicle including the same.

BACKGROUND

Light emitting diode (LED) modules are used in various fields such as vehicle lamps. FIG. 1 is a conceptual diagram illustrating an LED module 1 according to the related art. As illustrated in FIG. 1, the LED module 1 according to the related art has a problem in that most of light emitted from an LED 2 moves only in a forward direction, and thus structures such as a reflective plate 3 are required to move the light to lateral sides. Accordingly, it is necessary to secure a space of 20 mm or more, which may cause a problem in that a weight of the entire LED module increases. Further, due to these structures, there is a problem in that arrangement of the LED module is restricted, and implementation of a free design is difficult.

Further, in the LED module according to the related art, since most of the light moves only in the forward direction, the brightness of a portion in which the light is mainly gathered becomes higher than a peripheral portion. FIG. 2 is a conceptual diagram illustrating a vehicle lamp to which the LED module according to the related art is applied. As illustrated in FIG. 2, in the case of the LED module according to the related art, there is a problem in that it is difficult to secure the uniformity of brightness of the vehicle lamp L to which the LED module according to the related art is applied.

SUMMARY

The present disclosure has been made to solve the above-mentioned problems occurring in the prior art while advantages achieved by the prior art are maintained intact.

An aspect of the present disclosure provides an LED module in which a volume of a product is reduced and a weight thereof is reduced.

Another aspect of the present disclosure provides an LED module in which the uniformity of brightness may be secured.

Still another aspect of the present disclosure provides an LED module capable of increasing the quantity of light directed to a front side.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, there is provided a light emitting diode (LED) module including a cover part, a substrate part connected to a front side of the cover part, a light emitting part that is electrically connected to the substrate part, is disposed in front of the substrate part, and emits light through a side surface thereof, a lens part surrounding the side surface of the light emitting part and disposed in front of the substrate part, and a panel part into which the lens part is inserted and which is disposed in front of the substrate part, wherein an indentation region having a shape indented toward a front side is formed on a rear surface of the panel part, a plurality of lens parts are formed, and the indentation region is formed between two adjacent lens parts among the plurality of lens parts.

In another example, the lens part may have a shape which is obtained by cutting an ellipse in half along a central axis and in which a front region that is a front side end is concave toward a rear side when viewed from a lateral side.

In still another example, an uneven region that is provided to scatter the light may be formed on a rear surface of the front region of the lens part.

In yet another example, the LED module may further include a reflective layer that is coupled to a rear surface of the front region of the lens part and reflects light.

In yet another example, a plurality of light emitting parts may be formed, and the plurality of light emitting parts may be spaced apart from each other in a left-right direction.

In yet another example, the number of light emitting parts may correspond to the number of plurality of lens parts.

In yet another example, the indentation region may have a shape in which a width in a left-right direction is narrowed toward the front side.

In yet another example, when one direction among directions perpendicular to a front-rear direction and the left-right direction is a reference direction, the indentation region may be defined by a first surface extending in the left-right direction and perpendicular to the front-rear direction, a second surface extending obliquely from a left end of the first surface toward a rear side and a left side, and a third surface obliquely extending from a right end of the first surface toward the rear side and a right side when viewed from the reference direction.

In yet another example, when one direction among directions perpendicular to a forward direction and a leftward direction is a reference direction, the indentation region may be defined by a curved surface that is convex toward a front side when viewed from the reference direction.

In yet another example, the panel part may include a first groove recessed and formed in a rear surface thereof to correspond to the shape of the lens part, and the lens part may be inserted into the first groove.

In yet another example, when a region of the panel part, which defines the first groove, is a groove region, the groove region may have a serration shape.

In yet another example, an outer surface of the lens part may have a shape corresponding to the shape of the groove region.

In yet another example, the LED module may further include a deposition layer coupled to a front surface of the substrate part and disposed between the panel part and the substrate part.

In yet another example, the deposition layer may have a shape corresponding to a shape of the rear surface of the panel part.

In yet another example, the substrate part may have a shape corresponding to a shape of the rear surface of the panel part.

According to another aspect of the present disclosure, there is provided a vehicle including a vehicle body, and an LED module inserted into the vehicle body, wherein the LED module includes a light emitting part that emits light through a side surface thereof, a lens part surrounding the side surface of the light emitting part, and a panel part into which the lens part is inserted toward a rear side, and the panel part has an indentation region that has a shape indented toward a front side on a rear surface and is spaced apart from a region, into which the lens part is inserted, in a left-right direction.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
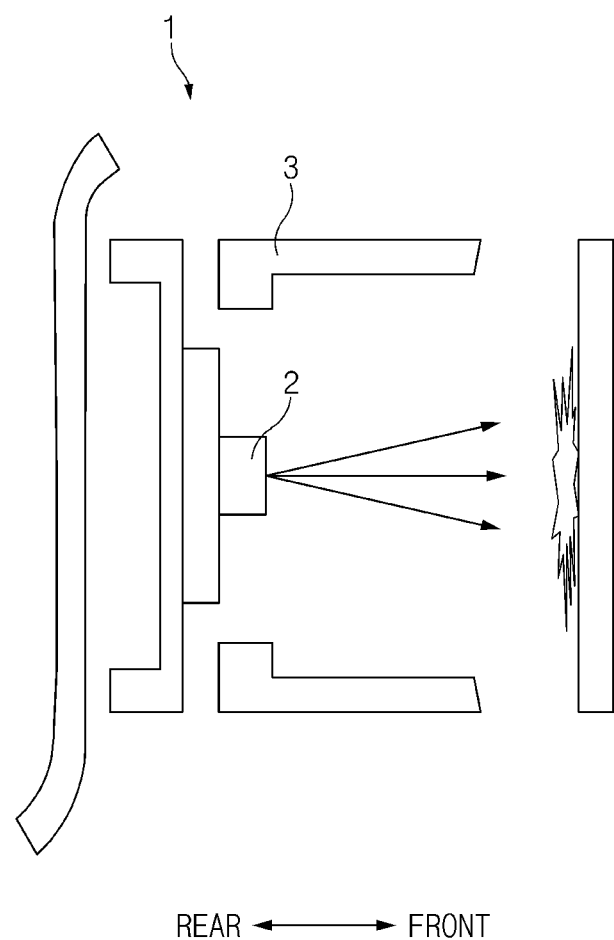
FIG. 1 is a conceptual diagram illustrating a light emitting diode (LED) module according to the related art.
Figure 2:
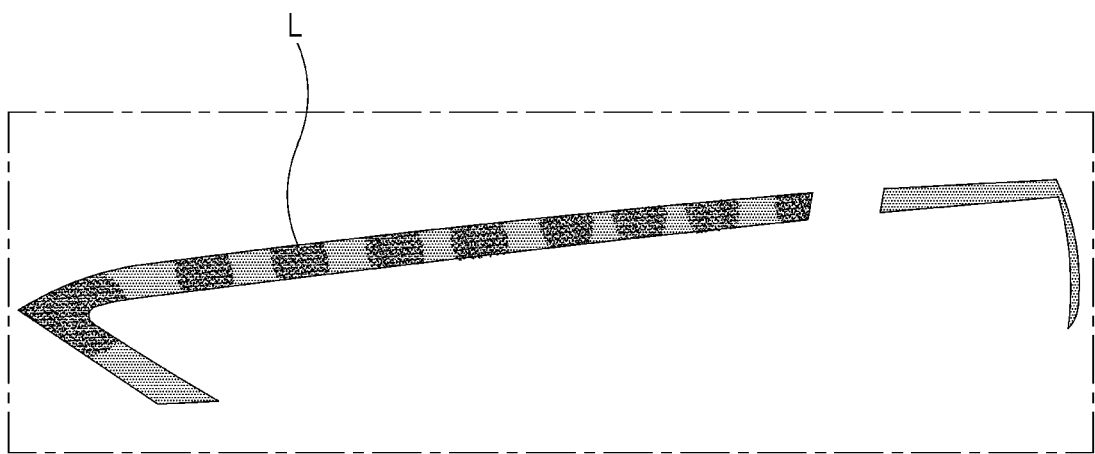
FIG. 2 is a conceptual diagram illustrating a vehicle lamp to which the LED module according to the related art is applied.

Hereinafter, some embodiments of the present disclosure will be described in detail with reference to the exemplary drawings. When components in the drawings are designated by reference numerals, the same components have the same reference numerals as far as possible even though the components are illustrated in different drawings. Further, in description of the embodiments of the present disclosure, when it is determined that a detailed description of a related well-known configuration or function disturbs understanding of the embodiments of the present disclosure, the detailed description will be omitted.

LED Module According to First Embodiment

Figure 3:
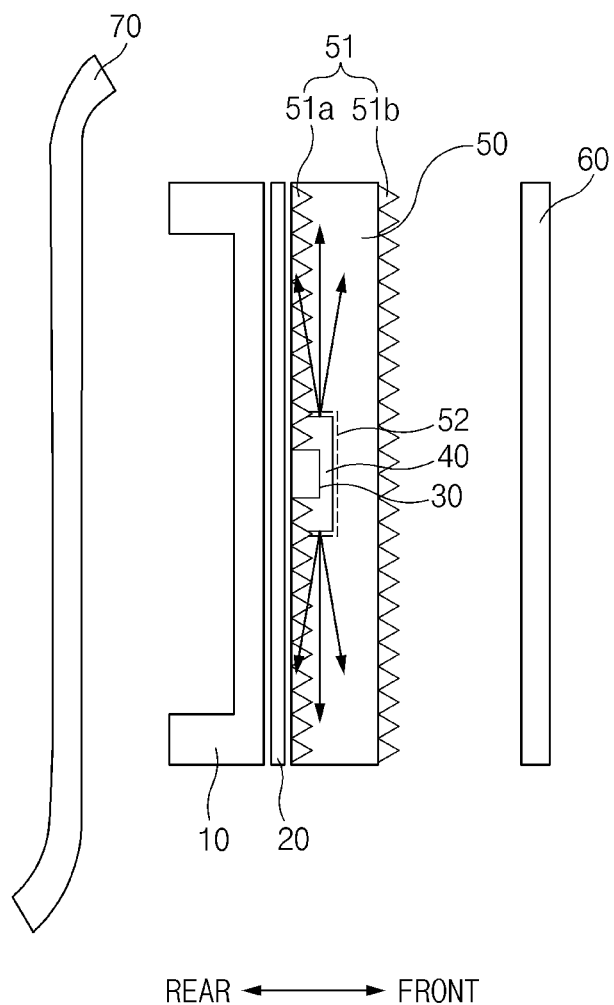
FIG. 3 is a conceptual diagram illustrating an LED module according to a first embodiment of the present disclosure.

A light emitting diode (LED) module according to a first embodiment of the present disclosure relates to an LED module that may be applied to a vehicle lamp or the like. FIG. 3 is a conceptual diagram illustrating an LED module according to a first embodiment of the present disclosure. Arrows in FIG. 3 may mean paths of light emitted from a light emitting part.

<Basic Component of LED Module According to First Embodiment>

As illustrated in FIG. 3, the LED module according to the first embodiment of the present disclosure may include a cover part 10, a substrate part 20, a light emitting part 30, a lens part 40, and a panel part 50. The substrate part 20 may be connected to a front side of the cover part 10. The substrate part 20 may be a general printed circuit board (PCB). The substrate part 20 may be formed in white. In this case, when a white LED is applied to the light emitting part 30, which will be described below, high reflectance of the substrate part 20 is secured, and thus visibility may be improved. However, color of the substrate part 20 is not limited thereto, and various examples may be implemented according to color of the light emitting part 30. As an example, when the light emitting part 30 is a red LED, the substrate part 20 may be formed in red.

The light emitting part 30 may be electrically connected to the substrate part 20 and be disposed in front of the substrate part 20. The light emitting part 30 may be provided to emit light through side surfaces thereof. More preferably, the side surfaces of the light emitting part 30 may include four surfaces, and the light emitting part 30 may emit light through the above-described four surfaces.

The lens part 40 may surround the side surfaces of the light emitting part 30 and disposed in front of the substrate part 20. Although it is illustrated in FIG. 3 that the cross section of the lens part 40 has a quadrangular shape, there is merely illustrative, and the lens part 40 may have various shapes to form a uniform light distribution pattern. A detail description thereof will be made below. The lens part 40 may refract the light emitted from the light emitting part 30.

The panel part 50 may have an optic 51 having a fine protrusion shape on an outer surface thereof. The optic 51 may be provided to reflect, at various angles, the light emitted from the light emitting part 30. A plurality of optics 51 may be provided. Although it is illustrated in FIG. 3 that the size of the optic 51 is relatively large, there is merely for expression, and in reality, the optic 51 may be formed to have a fine size as compared to other components.

The LED module according to the first embodiment of the present disclosure may further include an outer lens 60. The outer lens 60 may be spaced apart from the panel part 50 in a forward direction. The outer lens 60 may serve as a cover for protecting, from the outside, an inner configuration of the LED module according to the present disclosure.

Further, the LED module according to the first embodiment of the present disclosure may further include a housing 70. The housing 70 may be disposed behind the cover part 10. The housing 70 may serve to protect the LED module by surrounding the LED module from the rear side.

That is, when the components are listed in an order from the rear side to the front side, the housing 70, the cover part 10, the substrate part 20, the light emitting part 30, the lens part 40, the panel part 50, and the outer lens 60 are arranged in a sequence thereof.

According to the present disclosure, since the light is emitted through the side surfaces of the light emitting part 30, a uniform lighting image may be implemented without securing an additional space in a front region of the light emitting part 30 for light diffusion. Thus, a volume occupied by the LED module may be significantly reduced.

Further, according to the present disclosure, the light is emitted through the side surfaces of the light emitting part 30, the plurality of fine optics 51 reflect the light at different positions at various angles, and thus uniform brightness may be secured.

Figure 4:
FIG. 4 is a conceptual diagram illustrating a vehicle lamp to which the LED module according to the first embodiment of the present disclosure is applied.

FIG. 4 is a conceptual diagram illustrating a vehicle lamp to which the LED module according to the first embodiment of the present disclosure is applied. In the LED module according to the first embodiment of the present disclosure, the light may be reflected at various angles, and thus when the LED module according to the first embodiment of the present disclosure is applied to a lamp, uniformity of the brightness of a lamp L' as in FIG. 4 may be secured.

Further, in the LED module according to the first embodiment of the present disclosure, since the uniformity of brightness is secured, the number of light sources to be arranged in one vehicle lamp may be reduced.

<First Optic 51a and Second Optic 51b>

The optic 51 may include a first optic 51a. The first optic 51a may be provided on a rear surface of the panel part 50 and recessed in a forward direction. The first optic 51a may be provided to reflect the light emitted from the side surfaces of the light emitting part 30 and guide the light toward the front side. The first optic 51a may mean not only one fine protrusion but also several aggregates.

As an example, the first optic 51a may have a shape in which a length thereof in a vertical direction is reduced toward the front side. For example, the first optic 51a may have a shape obtained by cutting an ellipse along the y axis. Alternatively, the first optic 51a may have a triangular shape having a line parallel to the y axis as one side. However, the present disclosure is not limited thereto, and the first optic 51a may have various shapes.

Further, the optic 51 may include a second optic 51b. The second optic 51b may be provided on the front surface of the panel part 50 and protrude forward. The second optic 51b may be provided to diffuse the light emitted from the side surfaces of the light emitting part 30 and guide the light toward the front side. The second optic 51b may also mean not only one fine protrusion but also several aggregates. Further, it is obvious that the second optic 51b also have various shapes of the first optic 51a.

The second optic 51b may have a shape corresponding to the first optic 51a. However, the corresponding shape herein does not necessarily mean the same shape but may mean arrangement having similarities under a predetermined rule.

For example, when the first optic 51a is alternately disposed in a triangular shape and a trapezoidal shape, the second optic 51b may be alternately disposed in a trapezoidal shape and a triangular shape.

Figure 5:
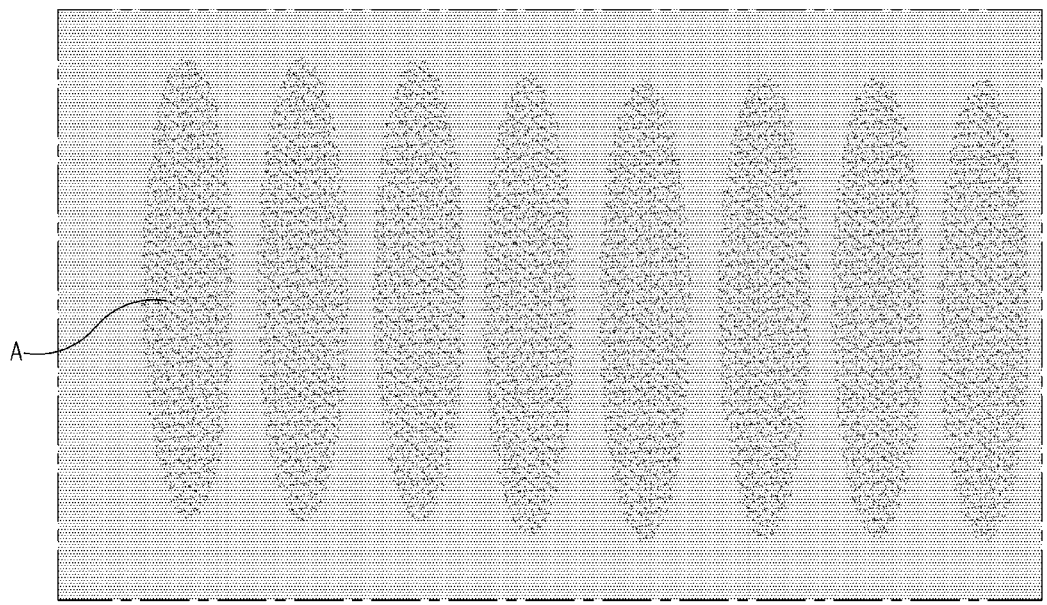
FIG. 5 is a conceptual diagram illustrating a light emitting pattern when a first optic and a second optic have triangular shapes.
Figure 6:
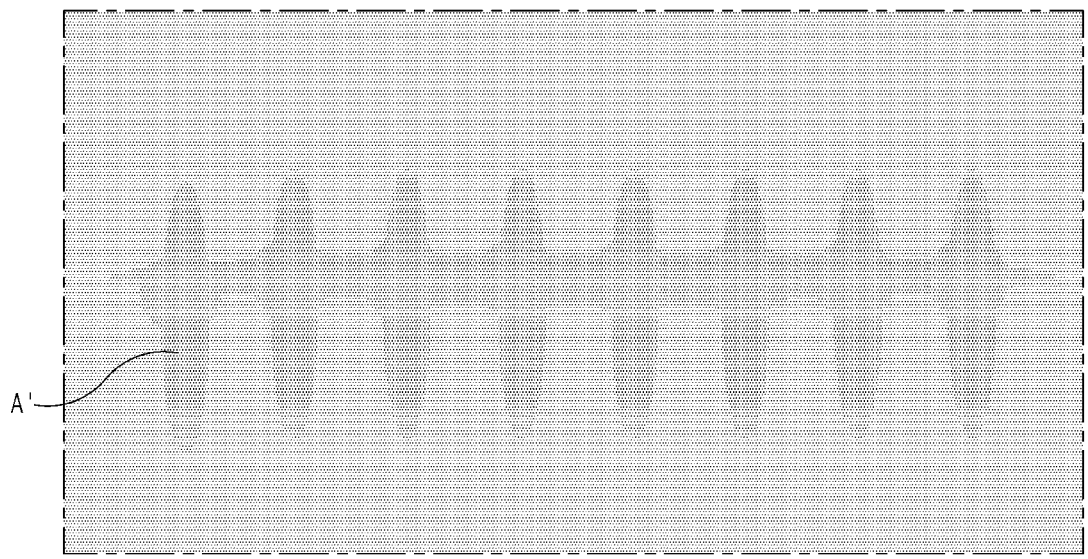
FIG. 6 is a conceptual diagram illustrating the light emitting pattern when the first optic and the second optic have elliptic shapes.

FIG. 5 is a conceptual diagram illustrating a light emitting pattern when the first optic 51a and the second optic 51b have triangular shapes. FIG. 6 is a conceptual diagram illustrating the light emitting pattern when the first optic 51a and the second. 7 optic 51b have elliptic shapes. As illustrated in FIGS. 5 and 6, the shapes of light emitting regions A and A' may be changed according to the shape of the optic 51. Thus, an operator may form different shapes of the first optic 51a and the second optic 51b according to the light emitting pattern to be formed.

<Relationship Between Sizes of Components>

Meanwhile, a length of the substrate part 20 in the vertical direction may correspond to a length of the cover part 10 in the vertical direction. Further, a length of the panel part 50 in the vertical direction may correspond to the length of the substrate part 20 in the vertical direction. Therefore, the length of the panel part 50 in the vertical direction may correspond to the length of the cover part 10 in the vertical direction.

Further, a length of the outer lens 60 in the vertical direction may correspond to the length of the panel part 50 in the vertical direction. Thus, the length of the outer lens 60 in the vertical direction may correspond to the lengths of the substrate part 20 and the cover part 10 in the vertical direction.

<Detailed Shape of Panel Part 50>

The panel part 50 may include a first groove 52. The first groove 52 may be recessed in the rear surface of the panel part 50 to correspond to the size of the lens part 40. Here, the corresponding does not necessarily mean coincidence and may also include a meaning that is beyond a space into which the lens part 40 may be inserted. For example, the first groove 52 may be formed such that there is no protrusion portion with respect to the panel part 50 when the lens part 40 is inserted into the first groove 52.

As an example, as illustrated in FIG. 3, the shape of the lens part 40 including the first groove 52 may have a shape obtained by rotating an "U" shape by 90 degrees.

The lens part 40 may be inserted into the first groove 52. For example, as the first groove 52 is formed to correspond to the size of the lens part 40, the lens part 40 may be inserted such that there is no protrusion portion with respect to the panel part 50 when the lens part 40 is inserted into the first groove 52.

Figure 7:
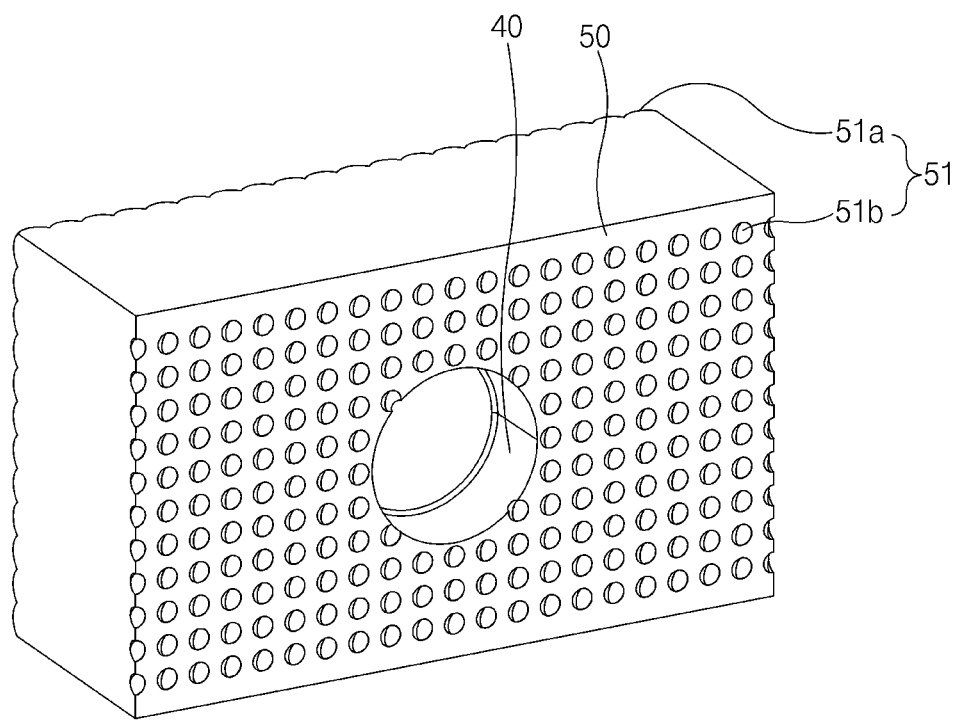
FIG. 7 is a view illustrating an example of the shape of a lens part.
Figure 8:
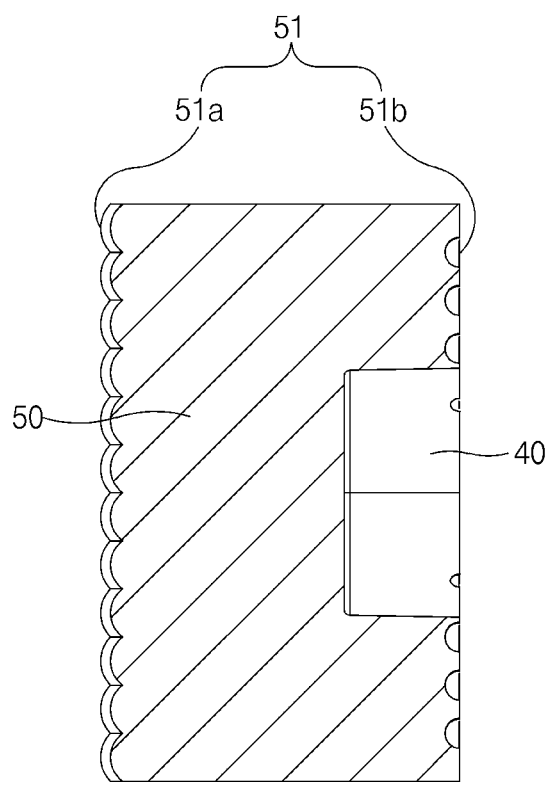
FIG. 8 is a cross-sectional view of FIG. 7.
Figure 9:
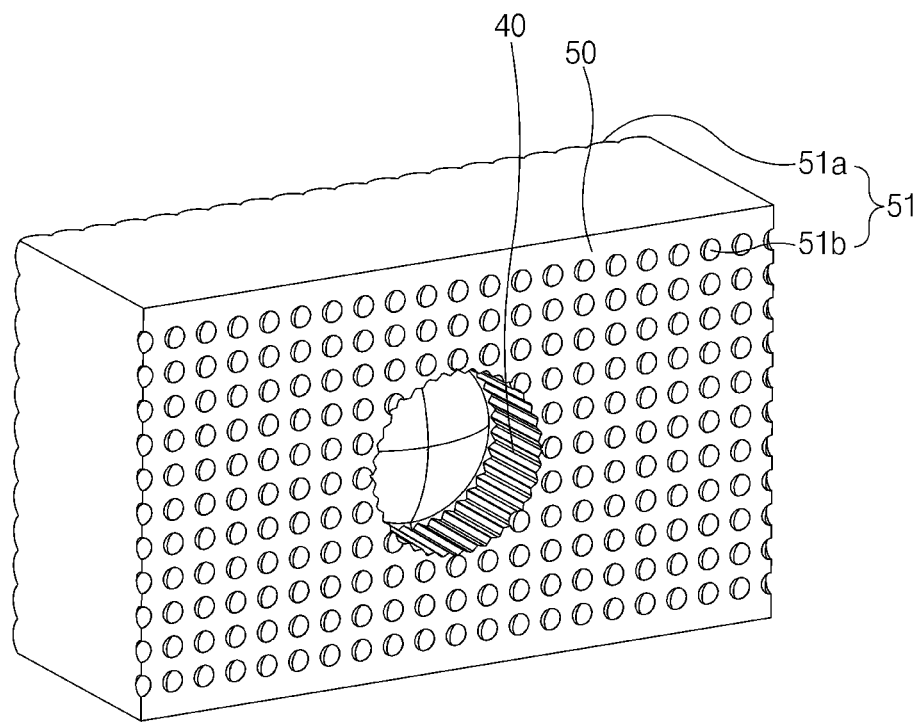
FIG. 9 is a view illustrating another example of the shape of the lens part.
Figure 10:
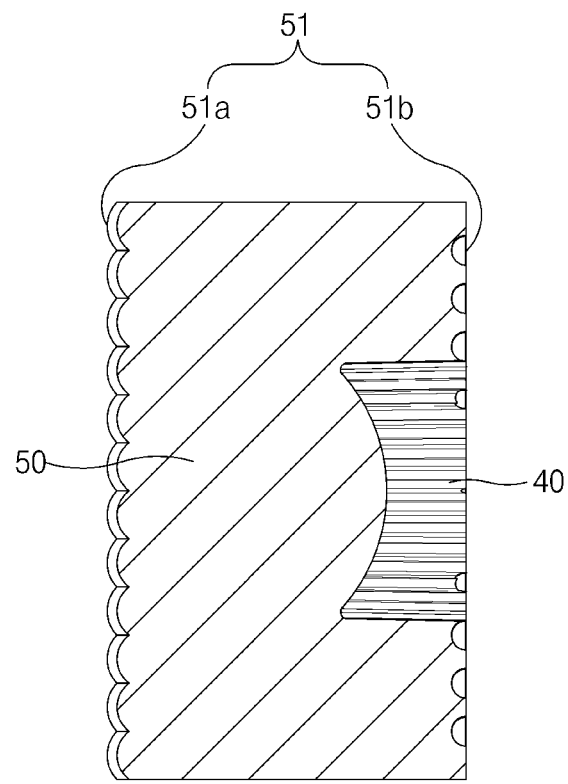
FIG. 10 is a cross-sectional view of FIG. 8.
Figure 11:
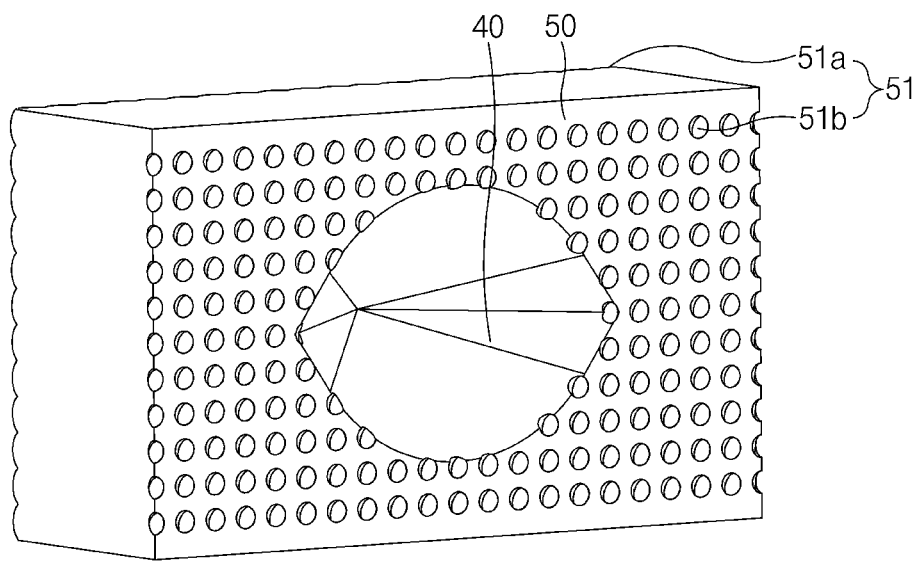
FIGS. 11, 13, 15, 17, 19, and 21 are views illustrating other examples of the shape of the lens part.
Figure 12:
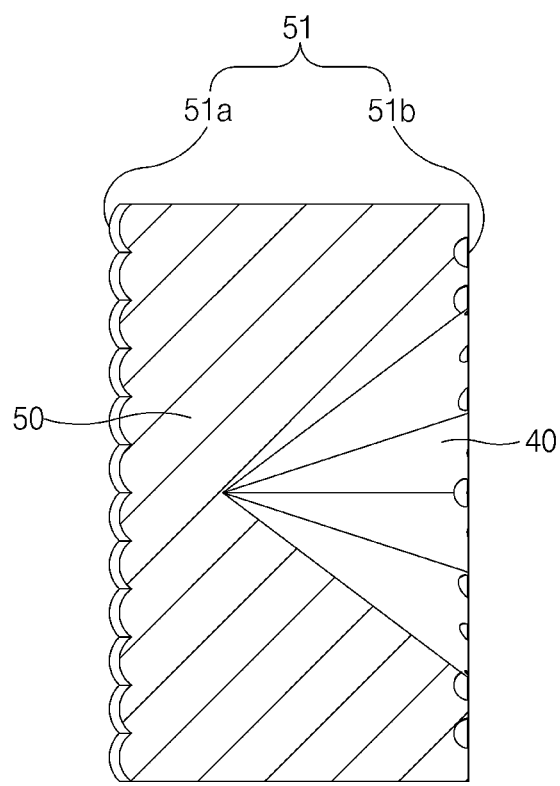
FIGS. 12, 14, 16, 18, 20, and 22 are cross-sectional views of FIGS. 11, 13, 15, 17, 19, and 21.
Figure 13:
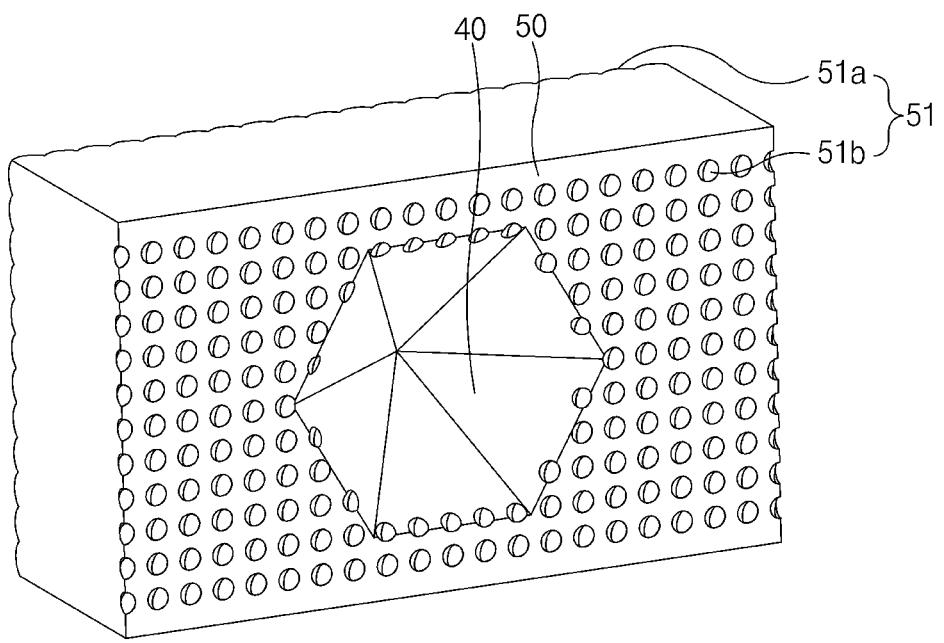
Figure 14:
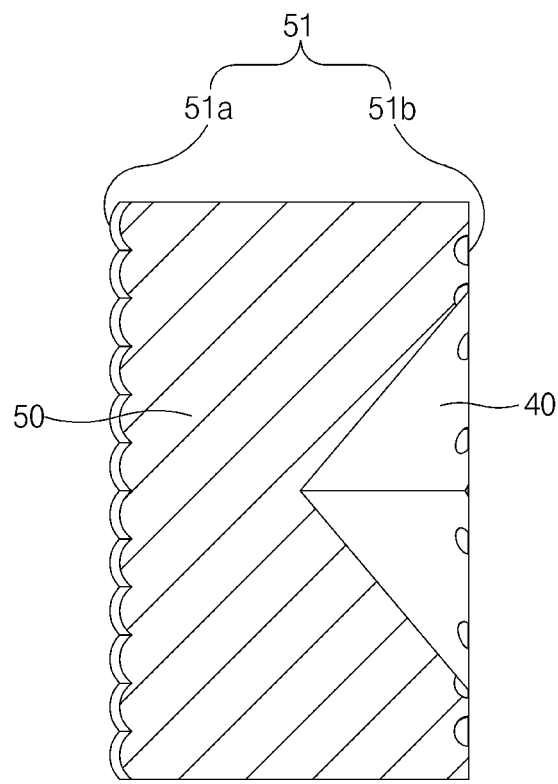
Figure 15:
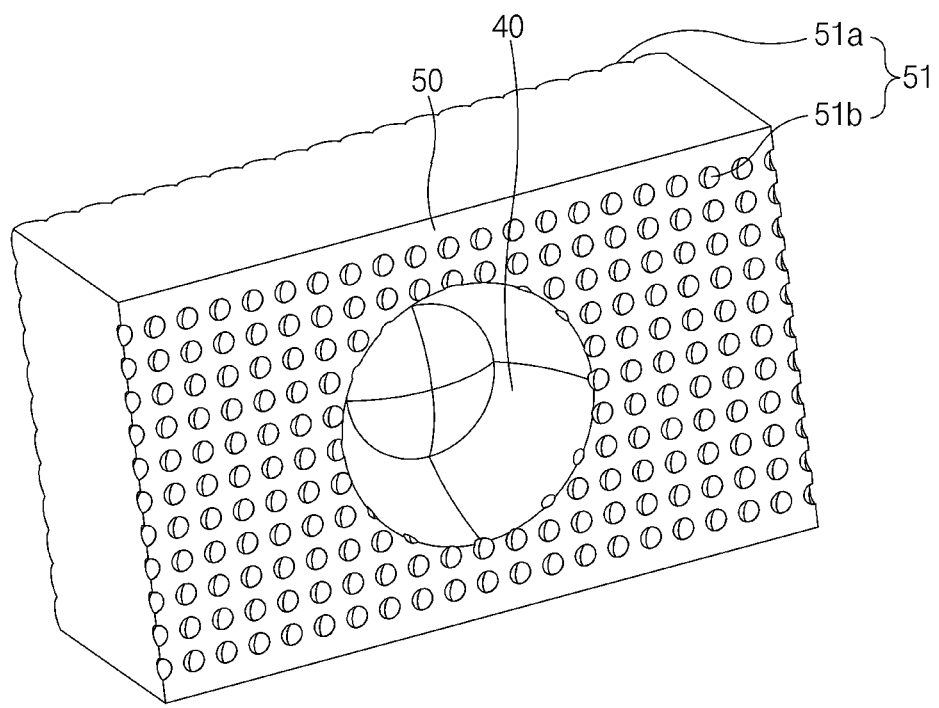
Figure 16:
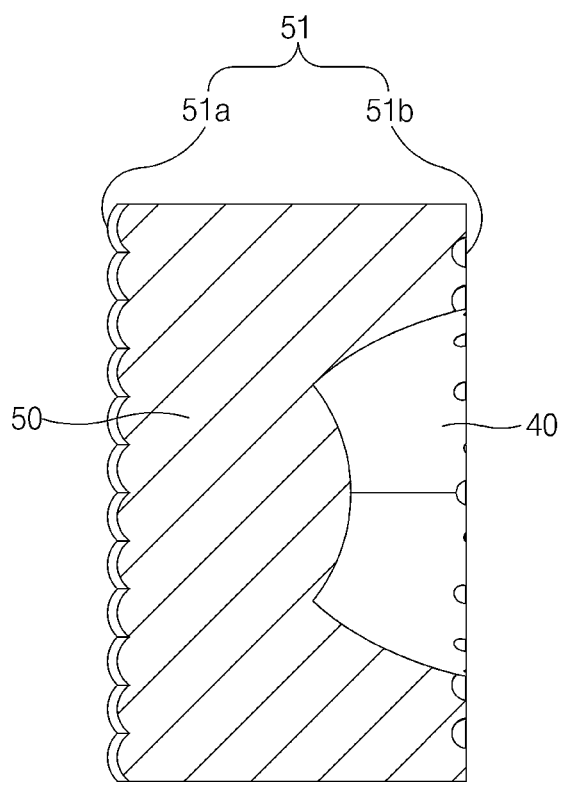
Figure 17:
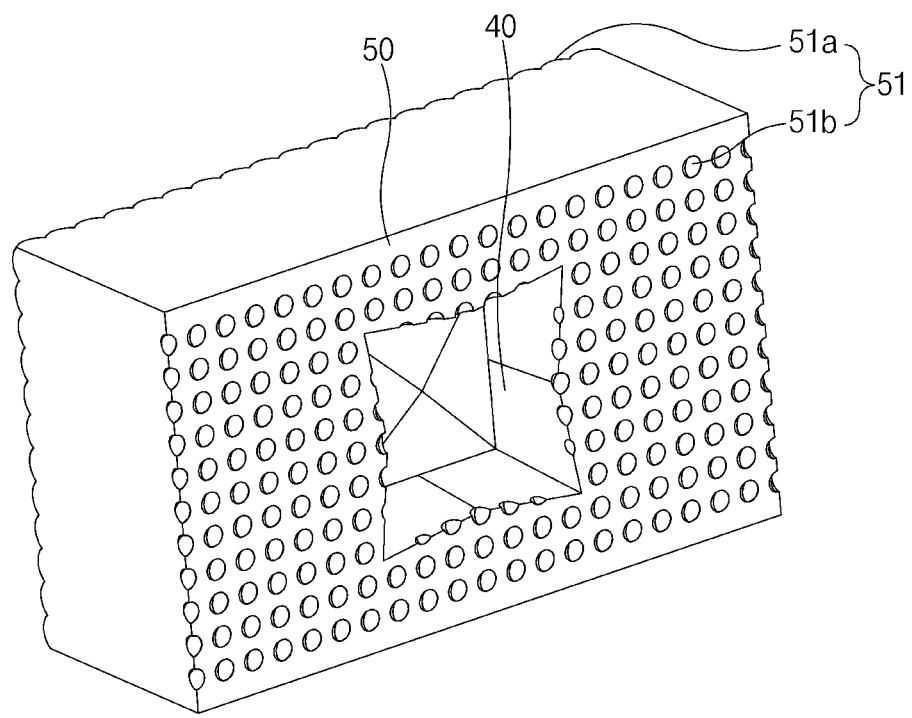
Figure 18:
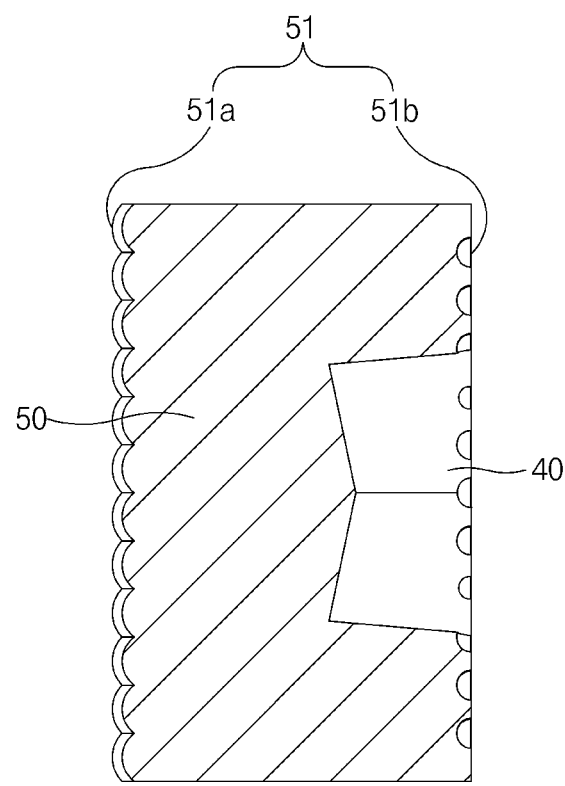
Figure 19:
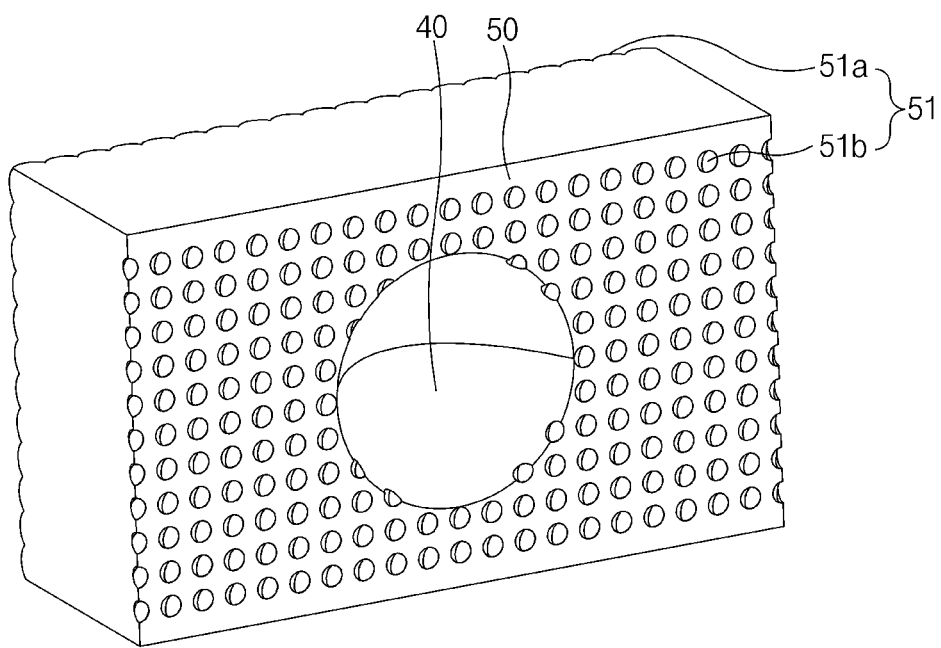
Figure 20:
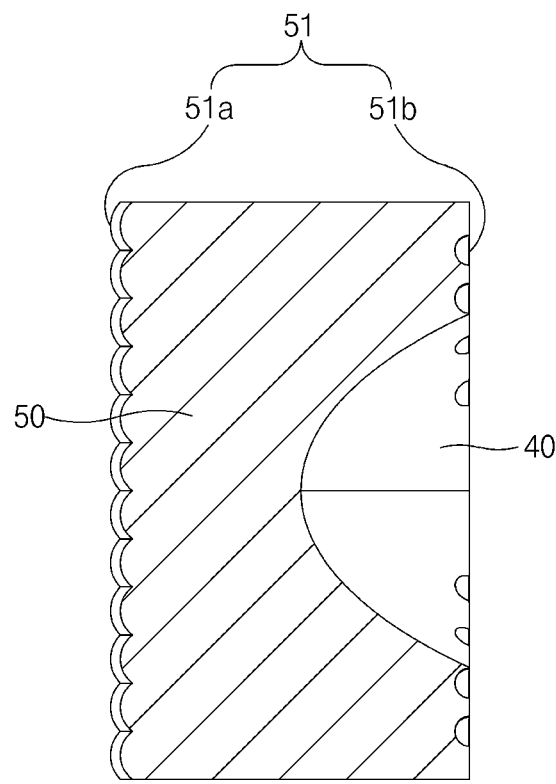
Figure 21:
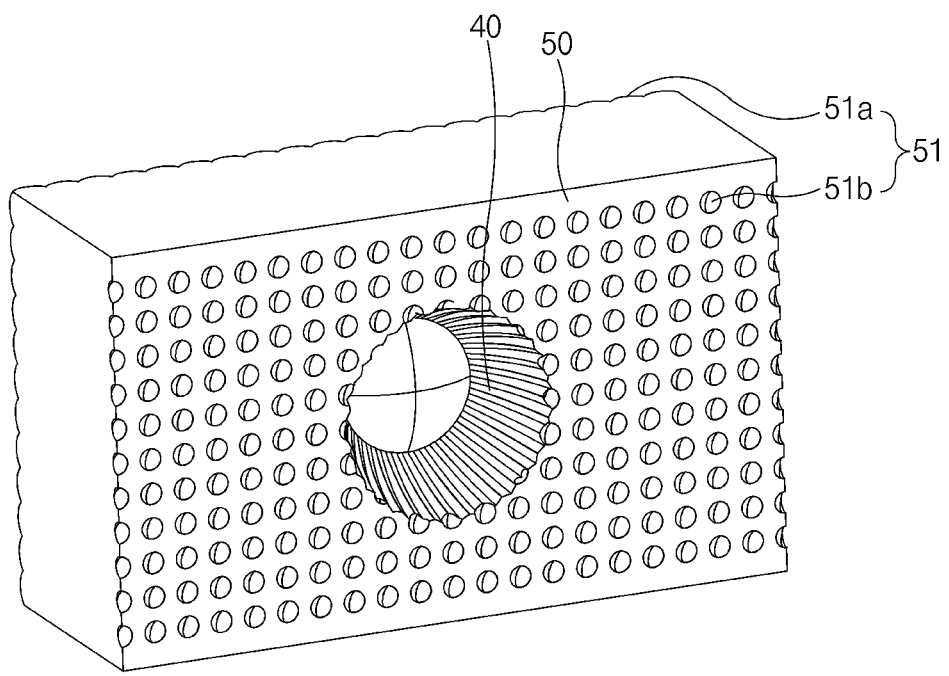
Figure 22:
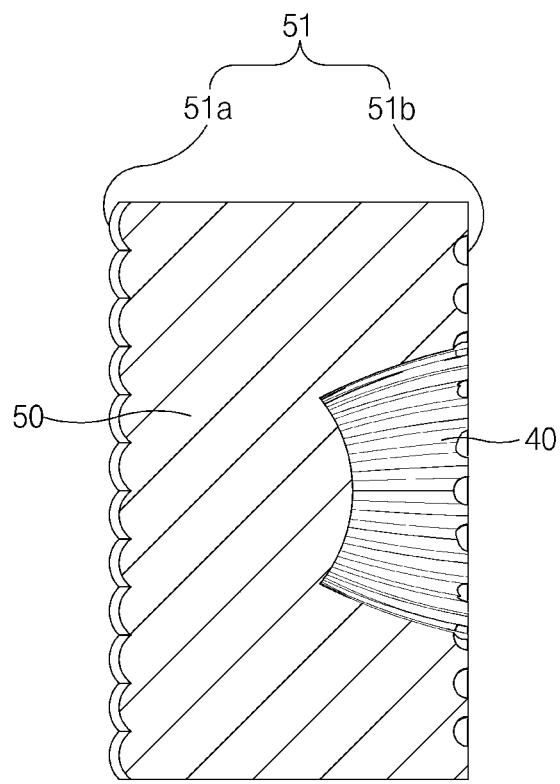

Meanwhile, the lens part 40 may be formed to have various shapes. FIG. 7 is a view illustrating an example of the shape of a lens part. FIG. 8 is a cross-sectional view of FIG. 7. FIG. 9 is a view illustrating another example of the shape of the lens part. FIG. 10 is a cross-sectional view of FIG. 8. Hereinafter, examples of the shape of the lens part will be described with reference to FIGS. 7 to 10.

As an example, as illustrated in FIGS. 7 and 8, the lens part 40 may have a shape obtained by cutting an ellipse in half along a central axis when viewed from the lateral side.

As another example, as illustrated in FIGS. 9 and 10, the lens part 40 may have a shape which is obtained by cutting an ellipse in half along a central axis and in which a front side end is concave toward the rear side when viewed from the lateral side. When the lens part 40 has the shape as illustrated in FIGS. 9 and 10, hot spots may be advantageously removed, and high light uniformity may be secured.

However, FIGS. 7 to 10 are merely examples of the shape of the lens part, and various modifications may be made according to needs of the those skilled in the art. FIGS. 11, 13, 15, 17, 19, and 21 are views illustrating other examples of the shape of the lens part. FIGS. 12, 14, 16, 18, 20, and 22 are cross-sectional views of FIGS. 11, 13, 15, 17, 19, and 21. FIGS. 11 to 22 are views illustrating various modifiable examples of the lens part.

For example, a serration shape may be added to the lens part 40. Alternatively, the lens part 40 may have a cylindrical shape or have a cylindrical shape of which a front side end is concave rearward.

As the shape of the lens part 40 is variously formed, since the refraction of the light emitted from the light emitting part 30 may be changed, a light path of the light emitting part 30 may be variously formed, and thus products may be manufactured to meet goals to be achieved, such as removing hot spots and ensuring light uniformity.

Meanwhile, in the LED module according to the first embodiment, it is preferable that a length of the panel part 50 in a front-rear direction be 7 mm with respect to a portion of the panel part 50 in which the first groove 52 is not formed, but the present disclosure is not limited thereto, and various modifications may be made within the scope desired by those skilled in the art.

<LED Module According to Second Embodiment>

Figure 23:
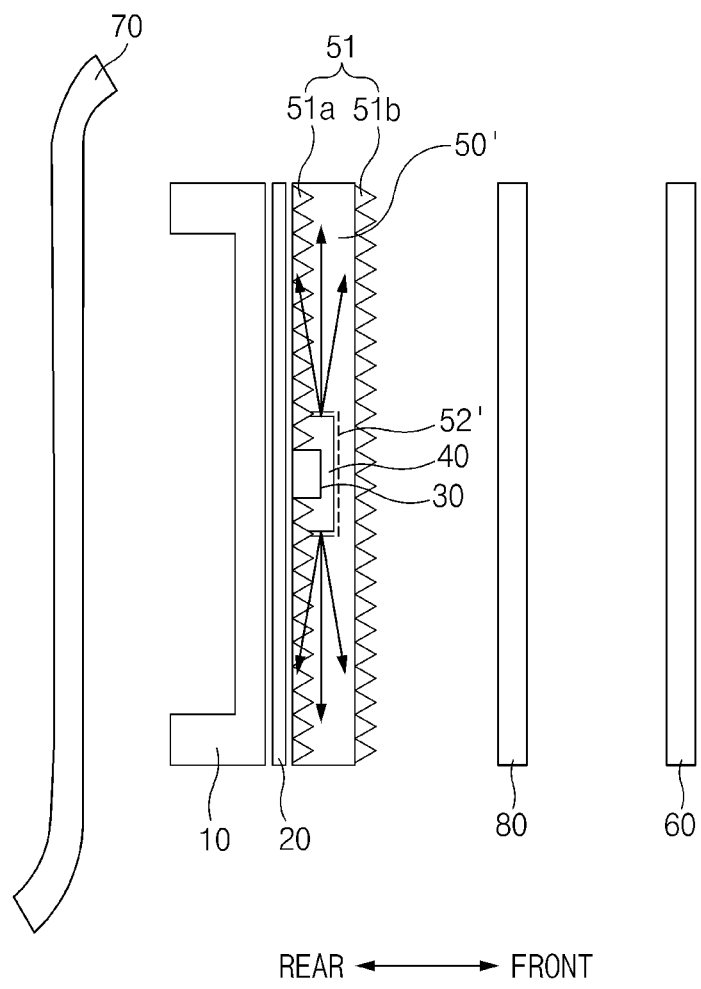
FIG. 23 is a conceptual diagram illustrating an LED module according to a second embodiment of the present disclosure.

FIG. 23 is a conceptual diagram illustrating an LED module according to a second embodiment of the present disclosure. The LED module according to the second embodiment of the present disclosure will be described with reference to FIG. 23 and FIGS. 1 to 22.

The LED module according to the second embodiment of the present disclosure is different from the LED module according to the first embodiment in the presence of an inner lens 80 and the thickness of the panel part 50. The same or equivalent components as those of the LED module according to the first embodiment are designated by the same or equivalent reference numerals, and a detailed description thereof will be omitted.

As illustrated in FIG. 23, the LED module according to the second embodiment may further include the inner lens 80. The inner lens 80 may be disposed between the outer lens 60 and a panel part 50'.

Meanwhile, a length of the inner lens 80 in the vertical direction may correspond to the length of the outer lens 60 in the vertical direction. Thus, the length of the inner lens 80 in the vertical direction may correspond to the lengths of the panel part 50', the substrate part 20, and the cover part 10 in the vertical direction.

Meanwhile, in the LED module according to the second embodiment, it is preferable that a length of the panel part 50' in a front-rear direction be 2.5 mm with respect to a portion of the panel part 50' in which a first groove 52' is not formed, but the present disclosure is not limited thereto, and various modifications may be made within the scope desired by those skilled in the art.

Meanwhile, it is obvious that, as the length of the panel part 50' in the front-rear direction is changed, the relative size of a space occupied by the first groove 52' may be also changed.

LED Module According to Third Embodiment

Figure 24:
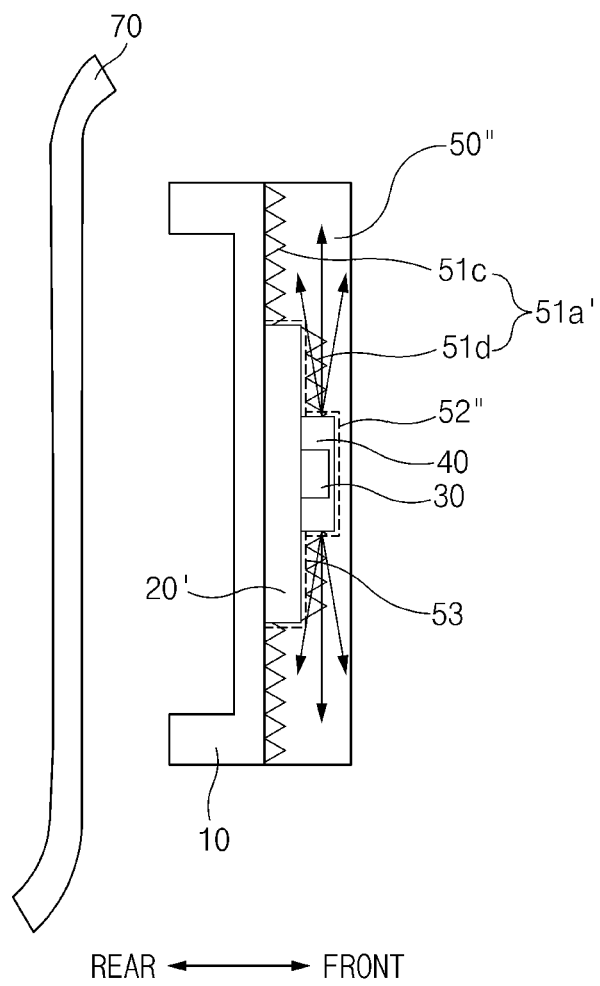
FIG. 24 is a conceptual diagram illustrating an LED module according to a third embodiment of the present disclosure.

FIG. 24 is a conceptual diagram illustrating an LED module according to a third embodiment of the present disclosure, Hereinafter, the LED module according to the third embodiment of the present disclosure will be described with reference to FIG. 24 and FIGS. 1 to 22.

The LED module according to the third embodiment of the present disclosure is different from the LED module according to the first embodiment in terms of the shape of the panel part 50" and the shape of a first optic 51a'. The same or equivalent components as those of the LED module according to the first embodiment are designated by the same or equivalent reference numerals, and a detailed description thereof will be omitted.

A length of a substrate part 20' of the LED module according to the third embodiment of the present disclosure in the vertical direction may be smaller than the length of the cover part 10 in the vertical direction. In this case, a panel part 50" may be formed to cover side surfaces of the substrate part 20'.

As an example, the panel part 50" may include a second groove 53 into which the substrate part 20' is inserted. The second groove 53 may communicate with a first groove 52", and a length of the second groove 53 in the vertical direction may be greater than the length of the first groove 52" in the vertical direction. In this case, the panel part 50" may be disposed to be adjacent to the cover part 10. Further, accordingly, the first groove 52" of the LED module according to the third embodiment may move toward a center of the panel part 50" as compared to the first groove 52 of the LED module according to the first embodiment.

As illustrated in FIG. 24, the first optic 51a' may include a first region 51c and a second region 51d. The first region 51c may be formed on a later surface side of the substrate part 20'. The second region 51d may be formed on a front surface side of the substrate part 20'. A step difference may be formed between the second region 51d and the first region 51c.

LED Module According to Fourth Embodiment

Figure 25:
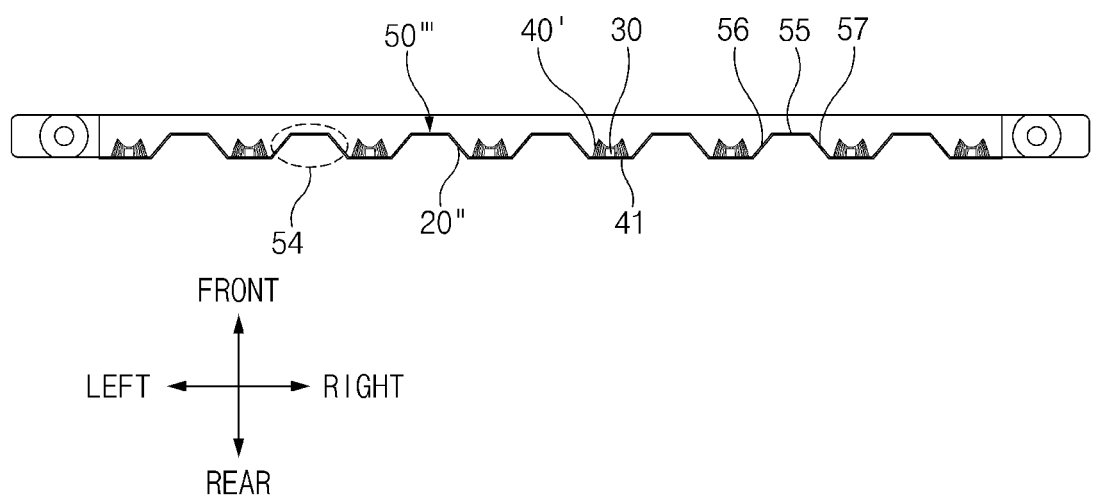
FIG. 25 is a perspective view illustrating a state in which a panel part and a substrate part of an LED module according to a fourth embodiment of the present disclosure are cut along a plane perpendicular to a reference direction.
Figure 26:
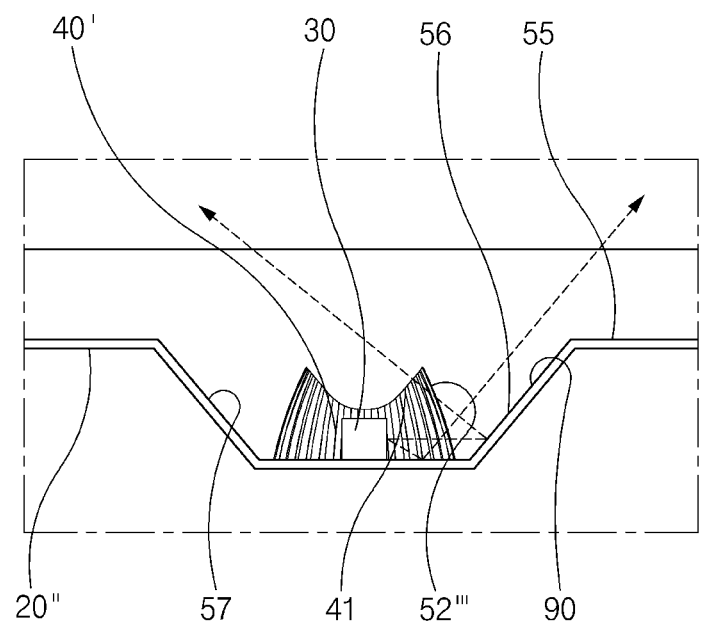
FIG. 26 is a partial enlarged view of FIG. 25.
Figure 26:
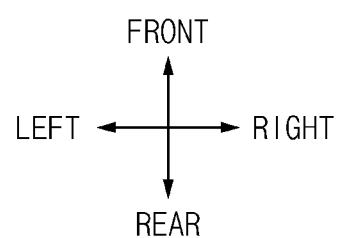
Figure 27:
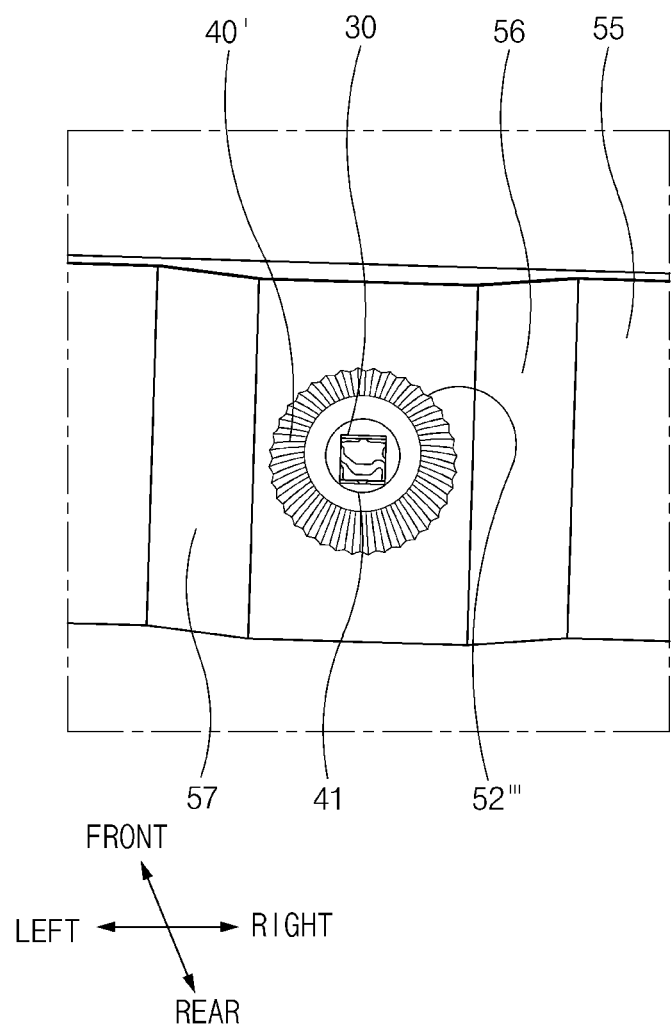
FIG. 27 is a view illustrating a state in which the panel part of the LED module according to the fourth embodiment of the present disclosure is viewed from the rear side; The reference direction may be any one of an upward direction and a downward direction.

FIG. 25 is a perspective view illustrating a state in which a panel part and a substrate part of an LED module according to a fourth embodiment of the present disclosure are cut along a plane perpendicular to a reference direction. FIG. 26 is a partial enlarged view of FIG. 25. FIG. 27 is a view illustrating a state in which the panel part of the LED module according to the fourth embodiment of the present disclosure is viewed from the rear side. The reference direction may be any one of an upward direction and a downward direction.

Hereinafter, the LED module according to the fourth embodiment of the present disclosure will be described with reference to FIGS. 25 to 27 and FIGS. 1 to 22. The LED module according to the fourth embodiment of the present disclosure is different from the LED module according to the first embodiment in terms of the shape of the panel part 50'" and the existence of an uneven region. The LED module according to the fourth embodiment of the present disclosure may include the cover part 10 (see FIG. 3), the substrate part 20', the light emitting part 30, a lens part 40', and a panel part 50'".

The light emitting part 30 may be electrically connected to the substrate part 20', may be disposed in front of the substrate part 20', and may emit light through side surfaces thereof. A plurality of light emitting parts 30 may be formed, and the plurality of light emitting parts 30 may be spaced apart from each other in a left-right direction.

The lens part 40' may surround the side surfaces of the light emitting part 30 and disposed in front of the substrate part 20'. A plurality of lens parts 40' may be formed. As an example, as illustrated in FIG. 25, the plurality of lens parts 40' are formed and may be spaced apart from each other in the left-right direction. The number of the lens parts 40' may correspond to the number of the plurality of light emitting parts 30.

Meanwhile, as described above, the panel part 50''' may include a first groove 52'', and the lens part 40' may be inserted into the first groove 52''. A groove region that is a region defining the first groove 52'' may have a serration shape. The serration shape may mean a sawtooth shape. An outer surface of the lens part 40' may have a shape corresponding to the shape of the groove region.

According to the fourth embodiment of the present disclosure, as illustrated in FIG. 26, the lens part 40' may have a shape which is obtained by cutting an ellipse in half along a central axis and in which a front region that is a front side end is concave toward the rear side when viewed from the lateral side.

The lens part 40' may be inserted into the panel part 50'''. The panel part 50'' may be disposed in front of the substrate part 20'. Meanwhile, an indentation region 54 having a shape that is intended toward the front side may be formed on a rear surface of the panel part 50'''. The indentation region 54 may be formed between two adjacent lens parts among the plurality of lens parts 40'. Meanwhile, the optic 51 (see FIG. 3) according to the first embodiment may be formed in the panel part 50''' or may not be formed in the panel part 50'''. FIGS. 25 to 27 illustrate a state in which the optic 51 (see FIG. 3) is not formed.

The indentation region 54 may have a shape in which a width thereof in the left-right direction is narrowed toward the front side. As an example, when viewed from a reference direction, the indentation region 54 may be defined by first to third surfaces 55, 56, and 57. The first surface 55 may be a surface extending in the left-right direction and perpendicular to the front-rear direction. The second surface 56 may be a surface extending obliquely from a left end of the first surface 55 toward the rear side and the left side. The third surface 57 may be a surface extending obliquely from a right end of the first surface 55 toward the rear side and the right side. When viewed in the reference direction, the indentation region 54 may have an equilateral trapezoidal shape.

In this case, the substrate part 20' may have a shape corresponding to a shape of the rear surface of the panel part 50'''.

Further, an uneven region 41 may be formed in the LED module according to the fourth embodiment of the present disclosure. In more detail, the uneven region 41 may be formed on a rear surface of a front region of the lens part 40'. The uneven region 41 may be formed by applying corrosion treatment to the front region of the lens part 40'. The uneven region 41 may be provided to scatter the light emitted from the light emitting part 30.

The LED module according to the fourth embodiment of the present disclosure may further include a deposition layer 90. The deposition layer 90 may be coupled to a front side surface of the substrate part 20' and may be disposed between the panel part 50''' and the substrate part 20'. The deposition layer 90 may be deposited on the front side surface of the substrate 20'.

The deposition layer 90 may have a shape corresponding to a shape of the rear surface of the panel part 50''. As described above, since the substrate part 20' may have a shape corresponding to the shape of the rear surface of the panel part 50''', the deposition layer 90 deposited on the substrate part 20' may also have a shape corresponding to the shape of the rear surface of the panel part 50'''. The deposition layer 90 may reflect the light directed toward the substrate part 20'.

Hereinafter, a path of the light emitted from the light emitting part 30 will be described. As illustrated in FIG. 26, light directed to the lateral side or the rear side among the light emitted from the light emitting part 30 is reflected by the deposition layer 90 and directed to the front side. Meanwhile, the light passing through the uneven region 41 may be scattered by the uneven region 41. The LED module according to the fourth embodiment of the present disclosure may guide the light directed to the lateral side or the rear side from the light emitting part 30 such that the light is directed to the front side through the indentation region 54, the deposition layer 90, and the uneven region 41.

LED Module According to Fifth Embodiment

Figure 28:
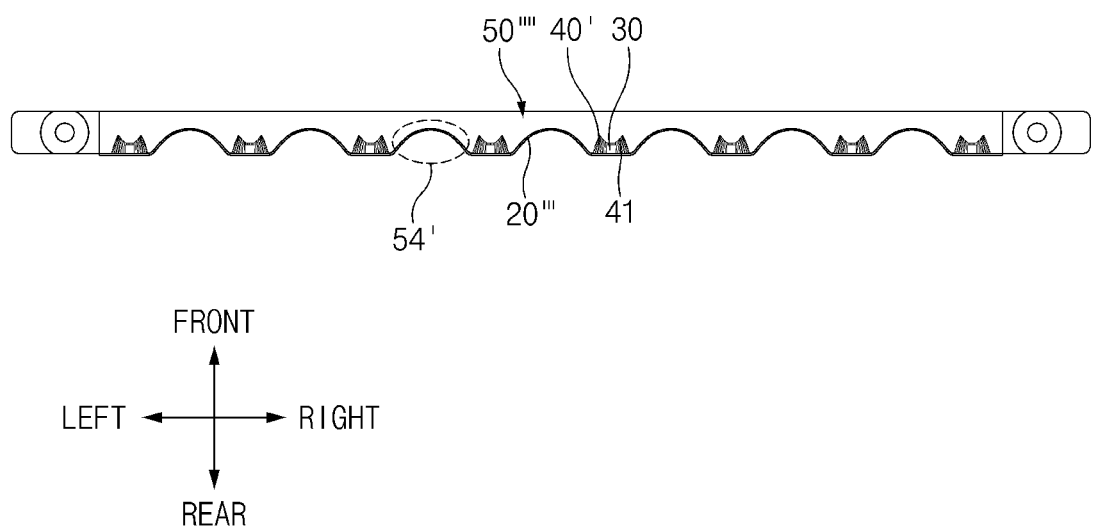
FIG. 28 is a perspective view illustrating a state in which a panel part and a substrate part of an LED module according to a fifth embodiment of the present disclosure are cut along a plane perpendicular to the reference direction.
Figure 29:
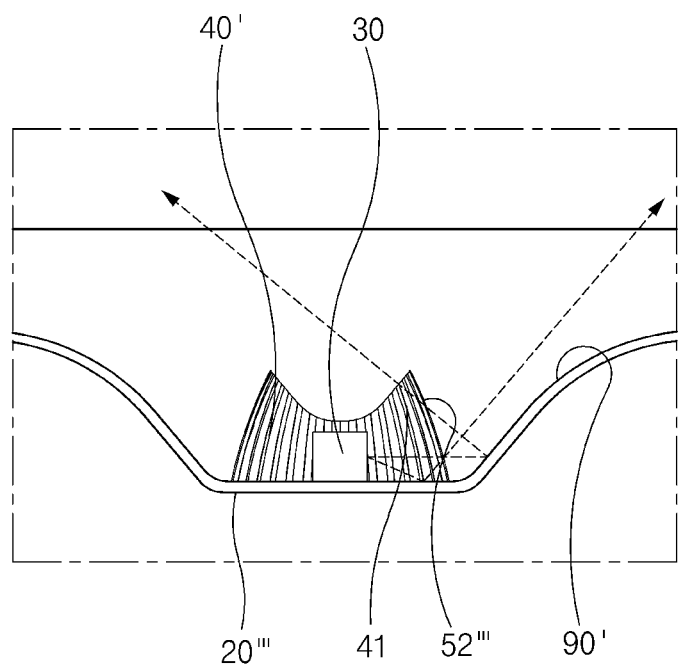
FIG. 29 is a partial enlarged view of FIG. 28.
Figure 30:
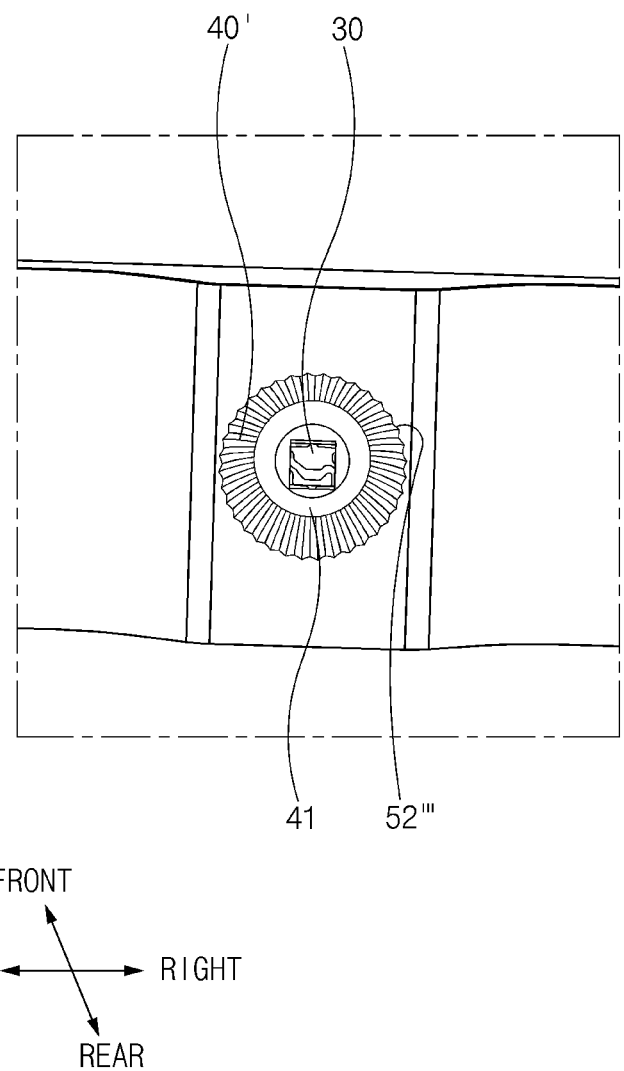
FIG. 30 is a view illustrating a state in which the panel part of the LED module according to the fifth embodiment of the present disclosure is viewed from the rear side.

FIG. 28 is a perspective view illustrating a state in which a panel part and a substrate part of an LED module according to a fifth embodiment of the present disclosure are cut along a plane perpendicular to the reference direction. FIG. 29 is a partial enlarged view of FIG. 28. FIG. 30 is a view illustrating a state in which the panel part of the LED module according to the fifth embodiment of the present disclosure is viewed from the rear side.

Hereinafter, the LED module according to the fifth embodiment of the present disclosure will be described with reference to FIGS. 28 to 30. The LED module according to the fifth embodiment of the present disclosure is different from the LED module according to the fourth embodiment in terms of the shape of the indentation region. Hereinafter, a difference between the fourth embodiment and the fifth embodiment will be mainly described, and a description duplicated with the fourth embodiment among the description of the fifth embodiment will be omitted.

An indentation region 54' of the LED module according to the fifth embodiment of the present disclosure may be defined by a curved surface that is convex toward the front side. As an example, when viewed in the reference direction, the shape of the indentation region may be similar to a shape of a semicircle. As the LED module according to the fifth embodiment has such a shape, a reflection angle is changed according to an incident position, and thus the LED module according to the fifth embodiment may have a light emitting pattern that is different from the LED module according to the fourth embodiment.

Meanwhile, in the case of the LED module according to the fifth embodiment, as the indentation region 54' is defined by a curved surface that is convex toward the front side, the shapes of a substrate part 20''' and a deposition layer 90' may be formed in a convex curved surface toward the front side to correspond to the shape of the panel part 50''' of the LED module according to the fifth embodiment.

LED Module According to Sixth Embodiment

Figure 31:
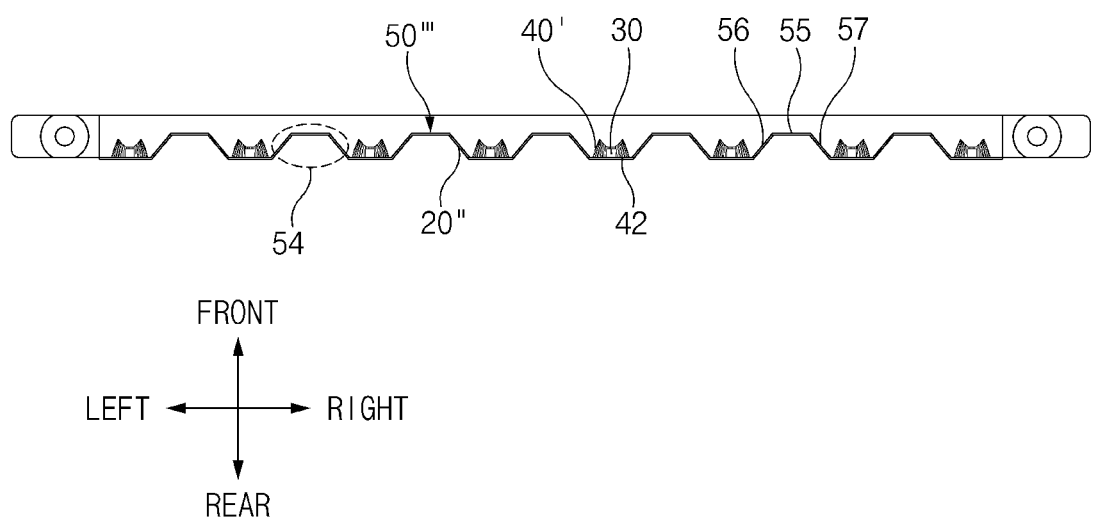
FIG. 31 is a perspective view illustrating a state in which a panel part and a substrate part of an LED module according to a sixth embodiment of the present disclosure are cut along a plane perpendicular to the reference direction.
Figure 32:
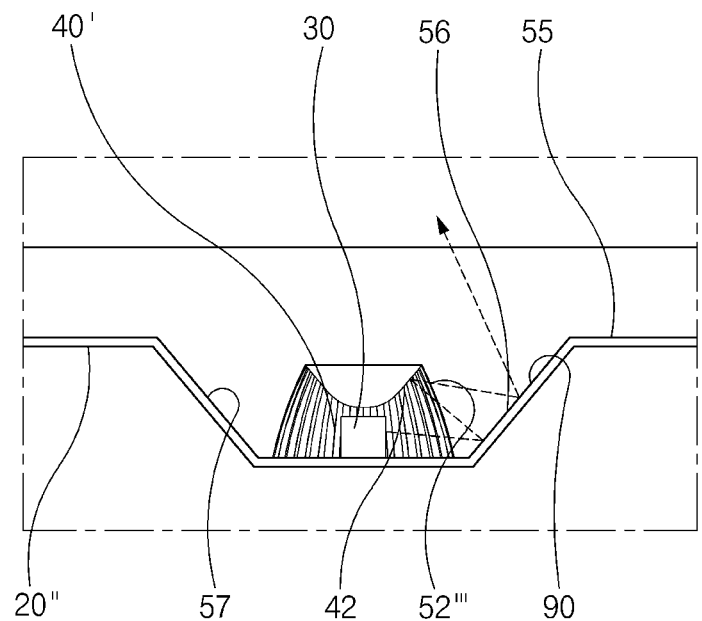
FIG. 32 is a partial enlarged view of FIG. 31.
Figure 33:
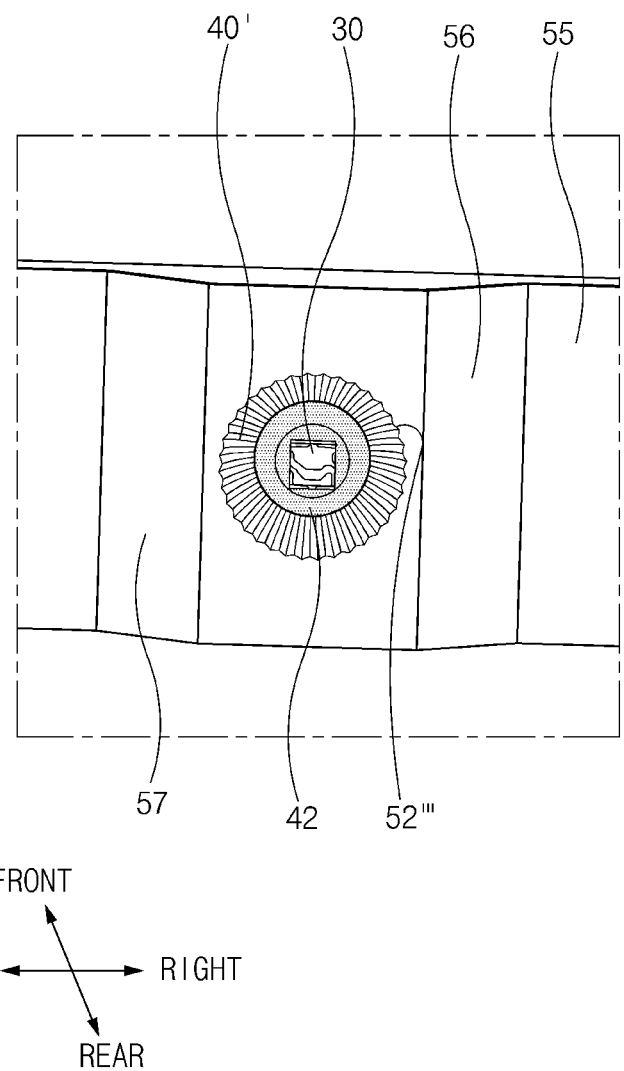
FIG. 33 is a view illustrating a state in which the panel part of the LED module according to the sixth embodiment of the present disclosure is viewed from the rear side.

FIG. 31 is a perspective view illustrating a state in which a panel part and a substrate part of an LED module according to a sixth embodiment of the present disclosure are cut along a plane perpendicular to the reference direction. FIG. 32 is a partial enlarged view of FIG. 31. FIG. 33 is a view illustrating a state in which the panel part of the LED module according to the sixth embodiment of the present disclosure is viewed from the rear side.

Hereinafter, the LED module according to the sixth embodiment of the present disclosure will be described with reference to FIGS. 31 to 33. The LED module according to the fifth embodiment of the present disclosure is different from the LED module according to the fourth embodiment in terms of the existence of a reflective layer 42. Hereinafter, a difference between the fourth embodiment, the fifth embodiment, and the sixth embodiment will be mainly described, and a description duplicated with the fourth embodiment and the fifth embodiment among the description of the sixth embodiment will be omitted.

The LED module according to the sixth embodiment of the present disclosure may further include the reflective layer 42. The reflective layer 42 may be coupled to a rear surface of the front region of the lens part 40' to reflect the light emitted from the light emitting part 30. As an example, the reflective layer 42 may be deposited and formed on the rear surface of the front region.

As the LED module according to the sixth embodiment has the reflective layer 42 instead of the uneven region 41 (see FIG. 3), as illustrated in FIG. 32, the light emitted from the light emitting part 30 and passing through the reflective layer 42 is reflected toward the deposition layer 90 once again, and thus the LED module according to the sixth embodiment may have a light emitting pattern different from the LED module according to the fourth embodiment.

<Vehicle>

Hereinafter, a vehicle including the LED module according to the first embodiment to the third embodiment of the present disclosure will be described. Here, the vehicle is not simply limited to a four-wheeled vehicle and should be interpreted to include a wide range of a transportation apparatus such as a two-wheeled vehicle. The vehicle may include a vehicle body and the LED module.

As illustrated in FIG. 3, the LED module may include the light emitting part 30, the lens part 40, and the panel part 50. The light emitting part 30 may be provided to emit light through side surfaces thereof. The light emitting part 30 may be a 4F LED. The lens part 40 may surround the side surfaces of the light emitting part 30. The lens part 40 may be inserted into the panel part 50. The panel part 50 may have the optic 51 having a fine protrusion shape on the outer surface thereof.

According to the present disclosure, a reflective plate is not required, a lens part may be in close contact with a cover part, and thus the volume of a product may be reduced, and the weight may be reduced.

Further, according to the present disclosure, light is emitted through a side surface of a light emitting part, a plurality of fine optics reflect the light at different positions at various angles, and thus uniform brightness may be secured.

Further, according to the present disclosure, since a deposition layer formed in front of a substrate part may guide, to a front side, the light emitted laterally and rearwardly, the quantity of the light directed to the front side may increase.

The above description is merely illustrative of the technical spirit of the present disclosure, and those skilled in the art to which the present disclosure belongs may make various modifications and changes without departing from the essential features of the present disclosure. Thus, the embodiments disclosed in the present disclosure are not intended to limit the technology spirit of the present disclosure, but are intended to describe the present disclosure, and the scope of the technical spirit of the present disclosure is not limited by these embodiments. The scope of protection of the present disclosure should be interpreted by the appended claims, and all technical spirits within the scope equivalent thereto should be interpreted as being included in the scope of the present disclosure.

What is claimed is:

1. A light emitting diode (LED) module comprising:
a cover part;
a substrate part connected to a front side of the cover part;
a light emitting part electrically connected to the substrate part, disposed in front of the substrate part, and being configured to emit light through a side surface thereof;
a lens part surrounding the side surface of the light emitting part and disposed in front of the substrate part; and
a panel part into which the lens part is inserted and which is disposed in front of the substrate part,
wherein an indentation region having a shape indented toward a front side is formed on a rear surface of the panel part,
wherein a plurality of lens parts are formed,
wherein the indentation region is formed between two adjacent lens parts among the plurality of lens parts,
wherein the indentation region has a shape in which a width in a left-right direction is narrowed toward the front side, the left-right direction being perpendicular to a front-rear direction, and
wherein a reference direction is perpendicular to the front-rear direction and the left-right direction, and the indentation region when viewed from the reference direction is defined by:
a first surface extending in the left-right direction,
a second surface extending from a left end of the first surface toward a rear side and a left side, and
a third surface extending from a right end of the first surface toward the rear side and a right side.

2. The LED module of claim 1, wherein the lens part has a shape obtained by cutting an ellipse in half along a central axis and in which a front region that is a front side end is concave toward a rear side when viewed from a lateral side.

3. The LED module of claim 2, wherein an uneven region configured to scatter the light is formed on a rear surface of the front region of the lens part.

4. The LED module of claim 2, further comprising:
a reflective layer coupled to a rear surface of the front region of the lens part and configured to reflect light.

5. The LED module of claim 1, wherein a plurality of light emitting parts are formed and are spaced apart from each other in a left-right direction.

6. The LED module of claim 1, wherein a number of light emitting parts corresponds to a number of the plurality of lens parts.

7. The LED module of claim 1, wherein the panel part includes a first groove recessed and formed in a rear surface thereof to correspond to the shape of the lens part, and
the lens part is inserted into the first groove.

8. The LED module of claim 7, wherein, when a region of the panel part, which defines the first groove, is a groove region, and the groove region has a serrated shape.

9. The LED module of claim 8, wherein an outer surface of the lens part has a shape corresponding to the shape of the groove region.

10. The LED module of claim 1, further comprising:
a deposition layer coupled to a front surface of the substrate part and disposed between the panel part and the substrate part.

11. The LED module of claim 10, wherein the deposition layer has a shape corresponding to a shape of the rear surface of the panel part.

12. The LED module of claim 1, wherein the substrate part has a shape corresponding to a shape of the rear surface of the panel part.

13. A light emitting diode (LED) module comprising:
a cover part;
a substrate part connected to a front side of the cover part;

a light emitting part electrically connected to the substrate part, disposed in front of the substrate part, and being configured to emit light through a side surface thereof;

a lens part surrounding the side surface of the light emitting part and disposed in front of the substrate part; and a panel part into which the lens part is inserted and which is disposed in front of the substrate part, wherein an indentation region having a shape indented toward a front side is formed on a rear surface of the panel part, wherein a plurality of lens parts are formed, wherein the indentation region is formed between two adjacent lens parts among the plurality of lens parts, wherein the indentation region has a shape in which a width in a left-right direction is narrowed toward the front side, and wherein, when one direction perpendicular to a forward direction and a leftward direction is a reference direction, the indentation region is defined by a curved surface that is convex toward a front side when viewed from the reference direction.

14. A vehicle comprising:

a vehicle body; and a light emitting diode (LED) module inserted into the vehicle body, wherein the LED module comprises:

a light emitting part configured to emit light through a side surface thereof;

a lens part surrounding the side surface of the light emitting part;

a panel part into which the lens part is inserted toward a rear side; and the panel part has an indentation region that has a shape indented toward a front side on a rear surface and is spaced apart from a region, into which the lens part is inserted, in a left-right direction, wherein the indentation region has a shape in which a width in a left-right direction is narrowed toward the front side, the left-right direction being perpendicular to a front-rear direction, and wherein a reference direction is perpendicular to the front-rear direction and the left-right direction, and the indentation region when viewed from the reference direction is defined by:

a first surface extending in the left-right direction, a second surface extending from a left end of the first surface toward a rear side and a left side, and a third surface extending from a right end of the first surface toward the rear side and a right side.

\* \* \* \* \*